United States Patent
Sturcken et al.

(10) Patent No.: US 8,697,457 B1
(45) Date of Patent: Apr. 15, 2014

(54) DEVICES AND METHODS FOR STACKING INDIVIDUALLY TESTED DEVICES TO FORM MULTI-CHIP ELECTRONIC MODULES

(75) Inventors: Keith K. Sturcken, Nokesville, VA (US); John A. Hughes, Falls Church, VA (US); Thomas E. Love, Gainesville, VA (US); Sheila J. Konecke, Leesburg, VA (US); Jeffrey Montag, Brandy Station, VA (US); Peter M. Wallace, Newfields, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 13 days.

(21) Appl. No.: 13/529,267

(22) Filed: Jun. 21, 2012

Related U.S. Application Data

(60) Provisional application No. 61/499,789, filed on Jun. 22, 2011.

(51) Int. Cl.
*G01R 31/26* (2006.01)

(52) U.S. Cl.
USPC .......... 438/18; 438/11; 438/14; 257/E21.521; 257/48; 257/777

(58) Field of Classification Search
USPC .......... 257/E25.006, E25.013, 685, 686, 723, 257/777, 778, E21.521, 48; 438/108, 109, 438/11, 14, 15, 18; 361/790
See application file for complete search history.

(56) References Cited

U.S. PATENT DOCUMENTS

| | | | |
|---|---|---|---|
| 5,434,745 A * | 7/1995 | Shokrgozar et al. | 361/735 |
| 5,477,933 A | 12/1995 | Nguyen | |
| 5,579,207 A * | 11/1996 | Hayden et al. | 361/790 |
| 5,585,675 A * | 12/1996 | Knopf | 257/774 |
| 5,641,113 A | 6/1997 | Somaki et al. | |
| 5,705,858 A | 1/1998 | Tsukamoto | |
| 5,870,289 A * | 2/1999 | Tokuda et al. | 361/779 |
| 5,914,535 A | 6/1999 | Brandenburg | |
| 6,059,173 A | 5/2000 | Mays et al. | |
| 6,104,204 A * | 8/2000 | Hayama et al. | 324/750.08 |
| 6,195,268 B1 * | 2/2001 | Eide | 361/803 |
| 6,281,577 B1 * | 8/2001 | Oppermann et al. | 257/724 |
| 6,555,399 B1 * | 4/2003 | Wood et al. | 438/15 |
| 6,620,638 B1 * | 9/2003 | Farrar | 438/14 |
| 6,794,741 B1 * | 9/2004 | Lin et al. | 257/686 |
| 6,977,440 B2 | 12/2005 | Pflughaupt et al. | |
| 7,149,095 B2 | 12/2006 | Warner et al. | |
| 7,241,645 B2 | 7/2007 | Zhao et al. | |
| 7,317,243 B2 * | 1/2008 | Wang | 257/668 |
| 7,335,975 B2 | 2/2008 | Cady et al. | |

(Continued)

OTHER PUBLICATIONS

Charles Banda, et al., Flip Chip Assembly of Thinned Silicon Die on Flex Substrates, 2008 IEEE, IEEE Transactions on Electronics Packaging Manufacturing, vol. 31, No. 1, Jan. 2008.

*Primary Examiner* — Chris Chu
(74) *Attorney, Agent, or Firm* — Daniel J. Long

(57) ABSTRACT

A method for manufacturing an electronic multi-chip module that involves stacking at least six tested devices to form the module. These devices may be individually tested prior to assembling the electronic module. After individually testing the devices, the devices may be stacked one on top of the other to form an electronic multi-chip module having at least six stacked devices. Other embodiments may be described and claimed.

15 Claims, 3 Drawing Sheets

(56) References Cited

U.S. PATENT DOCUMENTS

| | | |
|---|---|---|
| 7,355,272 B2 | 4/2008 | Kuroda et al. |
| 7,371,609 B2 | 5/2008 | Partridge et al. |
| 7,423,885 B2 | 9/2008 | Cady et al. |
| 7,453,157 B2 | 11/2008 | Haba et al. |
| 7,459,773 B2 | 12/2008 | Bolken et al. |
| 2001/0048151 A1 | 12/2001 | Chun |
| 2002/0074637 A1 | 6/2002 | McFarland |
| 2009/0057881 A1 | 3/2009 | Arana et al. |

\* cited by examiner

DEVICES AND METHODS FOR STACKING INDIVIDUALLY TESTED DEVICES TO FORM MULTI-CHIP ELECTRONIC MODULES

RELATED APPLICATIONS

This Application claims rights under 35 U.S.C. §119(e) from U.S. Application Ser. No. 61/499,789 filed Jun. 22, 2011, the contents of which are incorporated herein by reference.

TECHNICAL FIELD

Various embodiments described herein relate to electrical computers and digital processing systems generally, including electronic device stacking in such systems.

BACKGROUND

Semiconductors are manufactured from small blocks of semi-conductive material containing integrated electrical circuits. The semi-conductive material may be attached to a wafer of electronic-grade silicon (EGS). The combination of semi-conductive material and a wafer is called a "die." The die may be connected to other electronic components to form part of a larger electronic circuit. These large electronic circuits have been implemented in a variety of technology areas including, but not limited to aerospace and communication systems. Moreover, complex electronic circuits have been used in satellite applications. In these applications it is desirable to have electronic components that are capable of functioning in severe conditions and providing a high level of performance, reliability and density.

These technology systems, however, have limited space for electronic packaging. One known method of creating complex electronic systems having smaller electronic packaging is called "Bare" die stacking. Bare die stacking is where two or more dies are stacked one on top of another to create a multi-chip module. Stacking two or more dies in an integrated circuit allows the circuit to be more complex than a circuit containing a single die. Moreover, die stacking requires less electronic packaging than two dies placed next to one another.

Multi-chip electronic modules, however, are typically limited to three or four dies in a stack. Many of these electronic modules are manufactured using "standoff" interposers. These interposers are placed between the bare die and wire bonds to provide electrical connections. As the stacks of the bare die becomes progressively higher additional courses of wire bonding must be escaped from the stack. This approach not only becomes more and more unwieldy as additional die are stacked but also requires more space on the next higher level of packaging as the wires are connected. Moreover, the additional courses of wire bonding may also reduce device performance in high-speed electronic applications. The practical limit for stacking devices in this fashion is four high per packaging surface.

Stacking two or more dies together, however, increases the risk that the integrated circuit will not function. Dies cannot be fully tested prior to creating the multi-chip electronic module. Only when the electronic module is fully assembled can the dies be fully tested. If one die in the electronic module is defective, then the entire module is defective. Therefore, bare die stacking allows for creating complex electronic circuits having smaller electronic packaging, but this method increases the risk that the final multi-chip electronic module will not function.

A need, therefore, exists for a multi-chip electronic module having improved electronic circuit density without adversely affecting the circuit reliability.

SUMMARY

We have recognized that what is needed in order to solve the problem of the electronic circuit density within a complex electronic circuit is to create testable electronic chip packages that can be stacked six or more high. According to the present disclosure an electronic device may be fully tested prior to disposing the device onto a second device to form an electronic multi-chip module. The devices are capable of being tested when the devices are disposed onto a substrate creating a chip package.

The chip package allows the device to be fully mechanically and electrically tested prior to installation within a complex electronic circuit. The chip packages allow the devices to be fully tested, but also stacked several devices high. Moreover, the chip packages may also provide a four to one circuit density improvement in comparison with a printed circuit board. Testing these devices provides reasonable assurance that expensive and/or unique devices function properly prior to integrating these devices with other expensive components. Integrating untested devices into a complex system may result in the increase production costs and cause schedule delays, because replacing non-operating devices requires additional time and materials.

BRIEF DESCRIPTION OF THE DRAWINGS

Other objects, features and advantages will occur to those skilled in the art from the following description and accompanying drawings, in which.

DETAILED DESCRIPTION

Figure 1:
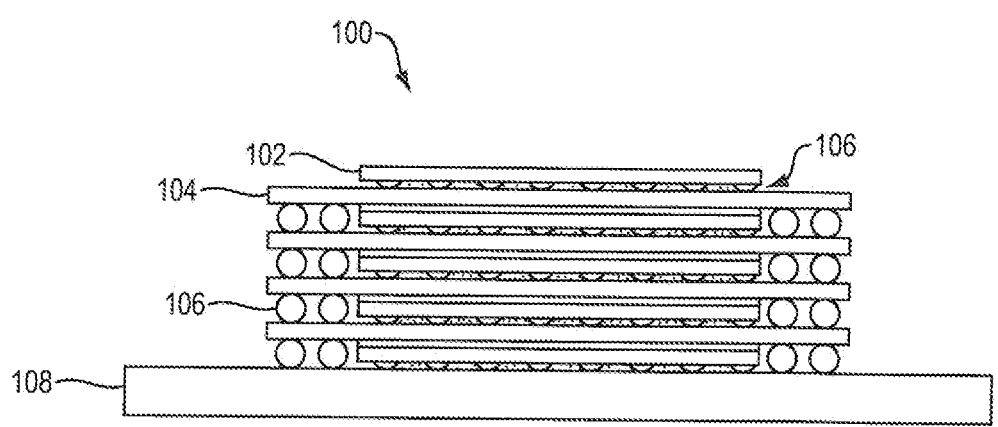
FIG. 1 is a diagram of a multi-chip electronic module according to an example embodiment of the present disclosure.

FIG. 1 is a diagram of a stacked multi-chip electronic module 100 according to an exemplary embodiment of the present disclosure. The electronic module 100 may include but is not limited to a plurality of devices 102, a plurality of substrates 104, a quantity of connective material 106 and packaging 108.

The device 102 may be a quantity of semi-conductive material containing one or more integrated electronic circuits that have been individually tested. In some embodiments the device 102 may be a die. In the exemplary embodiment the device 102 may be adapted for a "flip chip" connection for attaching to a substrate 104.

The substrate 104 may be manufactured out of any material or combination of materials that can support an integrated electronic circuit. In the exemplary embodiment the substrate 104 is manufactured from a thin film ceramic material. Ceramic materials are desirable in hermetic applications because ceramic material is very stable material that releases little or no gases. This attribute of ceramic materials significantly helps achieve and maintain a hermetic environment. Other substrate materials may include but are not limited to organic materials.

In the exemplary embodiment of this disclosure, the substrate 104 may be coated using a metallization process to improve electrical and thermal properties. The metallization process for the substrate 104 may be enhanced through a combination of thin film deposition and patterned electroplating to provide a thicker metal circuit with enhanced electrical characteristics. This process improves the substrate's adhesion properties and resistance to high temperature solder. The metallization process also increases the density and electrical conductivity of substrate 104. The metallization process may also include etching circuit patterns in the metallic layers using patterned artwork.

In the exemplary embodiment of the disclosure, the metallization process may include depositing a thin film layer of titanium-tungsten metal onto the substrate 104. Titanium-tungsten metal may be applied to the substrate 104 in a vapor form. This layer allows for a second layer to be applied to the substrate 104. In the exemplary embodiment, this second layer may be a layer of copper material applied using an electro-plating process. Similarly, a third layer of nickel material may be applied onto the copper layer to protect the underlying layers of material. This third layer may also be applied using an electro-plating method. In other embodiments the layer of nickel may be oxidized using a baking process to prevent solder material from contacting the circuit patterns during assembly of the multi-chip electronic module 100.

Moreover, in some embodiments of the disclosure a layer of gold may be deposited onto the termination points of the substrate 104 to improve electrical efficiency of the device 102.

Furthermore, the substrate 104 may also include electrical connections between the top and bottom surfaces of the substrate 104 by placing programmable-metallized vias through the substrate 104. These vias allow the connective material 106 to pass through the non-conducting portions of the substrate 104. The substrates 104 may have unique circuit patterns to allow electrical connection of several devices 102 each with their own terminations. In an alternate embodiment of the present disclosure, an extra layer of organic material may be added to the bottom surface of the substrate 104 to provide mechanical standoff and electrical insulation.

The substrate 104 may be attached to other substrates 104 using a quantity of connective material 106 providing an electronic and mechanical connection between two or more substrates 104. In some embodiments the connective material 106 may be solder. Other connective materials may include but are not limited to wiring, underfills, thermal interface materials (TIM), and conductive pastes and adhesives. In the exemplary embodiment of the disclosure the connective material 106 may be a quantity of solder balls arranged in a ball and grid array (BGA).

The connective material 106 may also provide a connection between devices 102 that are attached to different substrates 104. The connective material 106 in some embodiments of present disclosure may attach the device 102 to the substrate 104 providing an enhanced thermal-mechanical bond between the device 102 and substrate. 104. The connective materials 106 may provide thermal-mechanical bonds without adversely affecting other aspects of the multi-chip electronic module 100. In the exemplary embodiment of the disclosure the connective materials 106 may be dispensed through a small diameter syringe near the edge of the device allowing the connective material 106 to wick under the device 102 and around the electrical connections to form the thermo-mechanical bond with the substrate 104.

In some embodiments of the present disclosure, the connective materials 106 may include filled-organic adhesives. These adhesives may be applied between the device 102 and the substrate 104 to provide thermal conductivity and thermo-mechanical stress for the connecting solder balls. In the exemplary embodiment of the disclosure, the adhesive may be dispense through a small diameter syringe near the edge of the device 102 so that the adhesive wicks under the device 102 and around the electrical connections to form a thermo-mechanical bond. The rate of dispensing the adhesive may be controlled to prevent inadvertent flowing of the adhesive onto conducting surfaces of the substrate 104. The connective material 106 in some embodiments may also connect the substrate 104 to a quantity of external circuitry disposed onto packaging 108.

The packaging 108 may be joined to at least one device 102 to form the module 100. In other embodiments the stacked devices 102 may be positioned within the packaging 108. In the exemplary embodiment of the disclosure the packaging 108 may be a hermetic containment package to protect the stacked devices 102 from a rigorous environments for avionic and satellite applications.

Figure 2:
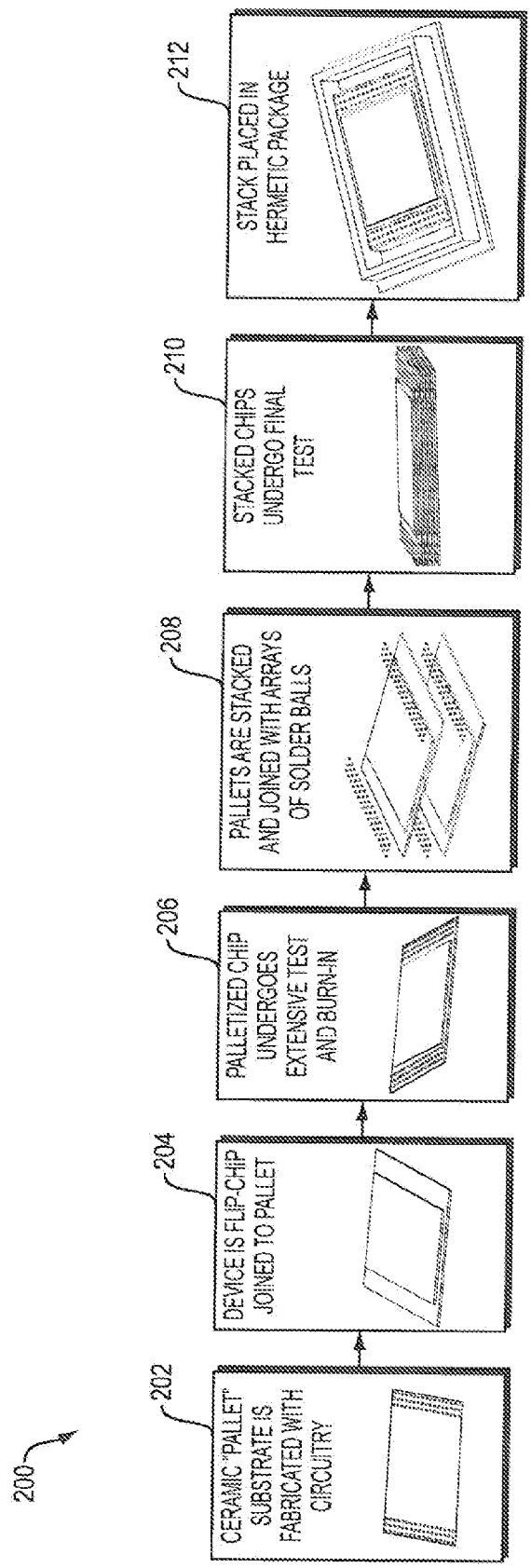
FIG. 2 is a flow chart of a method for manufacturing an electronic module wherein the devices are tested prior to stacking the devices six or more high to form the electronic module according to an example embodiment of the present disclosure.

FIG. 2 is a flowchart of a method for stacking six or more fully tested devices 200 according to an exemplary embodiment of the present disclosure. At block 202 a substrate containing electronic circuitry is fabricated. At block 204 the substrate may be joined to a device to form a chip package. The device may be joined using a flip chip joining method.

At block 206 the chip packages may be tested. The chip packages may be tested at high speed over high and low temperatures. In the exemplary embodiment of the disclosure the chip package may be subjected to mechanical, environmental, and burn-in testing. Environmental testing may include testing a device under similar conditions as those that may be present in the device's desired end-use environment to evaluate device operation. Once a microcircuit device has been placed on a substrate it may be electrically tested to verify its functionality and performance at a specified speed of operation. Unlike testing performed on a silicon wafer that has not yet been diced, this testing can be performed over hot and cold temperatures including military standard temperature ranges from −55° C. to 125° C.

In addition, devices mounted to the substrates may undergo other screening methods, such as, burn-in testing to electrically and thermally stress the device to verify that the device meets particular reliability requirements related to a device's particular end use. Performing a full array of tests and screenings prior to integrating devices into a multi-chip module reduces or eliminates the possibility of a non-functioning die. If a multi-chip module has a non-functioning die, then the module must either undergo costly rework to remove the non-functioning die or be scrapped. When an entire multi-chip module is scrapped, the functioning dies within the module cannot be recovered.

At block 208 the chip packages may be stacked six or more high one on top of another and joined together to form a multi-chip module. In the exemplary embodiment of the disclosure, the chip packages may be aligned and mounted one on top of another using solder balls arranged in a ball and grid array (BGA). This mounting technique creates a mechanical and electrical connection between chip packages. Alignment of the chip packages is important to ensure continuous and reliable electrical connections within the chip packages. Fixtures may be used to align the solder balls of one chip package with the input/output (I/O) pads of a second chip package. These fixtures may prevent movement and/or misalignment of the chip packages during assembly. For example, when the solder balls in a BGA are melted to form the chip package electrical connections there is tendency for the chip packages to move causing misalignment of the chip package electrical terminations.

Additional fixtures may also be used to align a stack of chip packages into a containment package. These fixtures may be manufactured from material capable of withstanding the heat of solder re-flow. When using these fixtures during a three-dimensional joining process the stack of devices may be mechanically and electrically connected into the next higher level of circuit packaging. The final connection between the chip packages may be made using a re-flow soldering technique. In some embodiments the devices may be stacked eight or more high.

In the exemplary embodiment of the disclosure the multi-chip module may undergo final testing as shown at block 210. Final testing may be accomplished prior to or after packaging the multi-chip module. In other embodiments, the multi-chip module may not undergo final testing.

Furthermore, in the exemplary embodiment of the disclosure the multi-chip module may be disposed within or on a package as shown at block 212. In yet other embodiments of the present disclosure, the multi-chip module may not be joined to any package.

Figure 3:
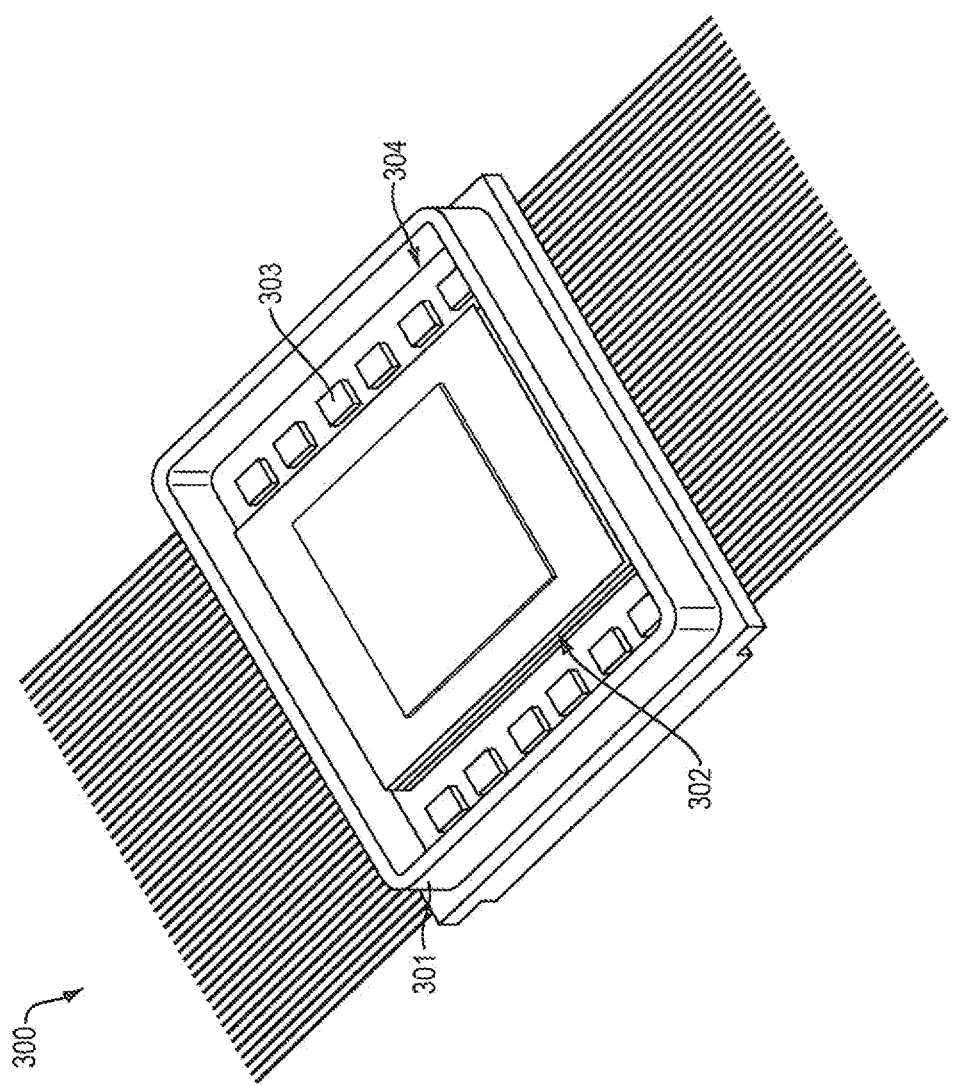
FIG. 3 is a three dimensional view of a fully assembled hermetic module with the stacked devices and capacitors placed into the cavity of the package. The sealing lid is not shown so internal components can be seen.

FIG. 3 is a three dimensional view electronic device 300 containing a quantity of stacked devices 302 positioned within a hermetic module 301 made from layers of ceramic with leads attached to make connection to the next level of circuit packaging. The hermetic module 301 may have a metal or ceramic wall with a metal lid could be sealed to forming and a hermetic cavity. At the base of the hermetic cavity there may be connection pads allowing the stacked devices 302 to be electrically connected through circuits in the multi-layered ceramic base and the attached leads. A number of capacitors 303 could also be joined to the package inside the hermetic cavity to improve electrical performance of the devices. Finally, a metal lid can be seal to the top edge of the hermetic cavity 304 using standard assembly methods to form a hermetic module to contain the stacked devices.

While the present disclosure has been described in connection with the preferred embodiments of the various figures, it is understood that other similar embodiments may be used or modifications or additions may be made to the described embodiments for performing the same function of the present disclosure without deviating therefrom. Therefore, the present disclosure should not be limited to any single embodiment, but rather construed in breadth and scope in accordance with the recitation of the appended claims.

It may be possible to execute the activities described herein in an order other than the order described. And, various activities described with respect to the methods identified herein can be executed in repetitive, serial, or parallel fashion.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

Other embodiments will occur to those skilled in the art and are within the following claims.

What is claimed is:

1. A method for manufacturing an electronic module, comprising:
    testing a plurality of devices using at least one end-use environmental condition to evaluate at least one device performance characteristic prior to assembling an electronic module; and
    stacking at least six devices to form the electronic module.

2. The method of claim 1 wherein the end-use environmental condition is a temperature range.

3. The method of claim 1 further comprising joining the devices to a plurality of substrates to form a plurality of chip packages.

4. The method of claim 3 further comprising insulating at least one surface of the plurality of substrates.

5. The method of claim 1 wherein at least one device is mechanically tested to determine whether the end-use environmental condition affects the performance of the plurality of devices.

6. The method of claim 1 wherein at least one device is tested to verify operation of the device within a temperature in range of 55° C. to 125° C.

7. The method of claim 1 further comprising positioning the electronic module within a package.

8. The method of claim 7 wherein the electronic module is hermetically sealed within the package.

9. A method of manufacturing an electronic module comprising:
    testing at least one device to verify at least one operational attribute of the device prior to stacking at least six devices to form the electronic module; and
    stacking at least six devices to form the electronic module.

10. The method of claim 9 further comprising joining a plurality of substrates to the plurality of devices using a plurality flip-chip connections to form a plurality of chip packages.

11. The method of claim 9 further comprising positioning the plurality of chip packages within a package.

12. The method of claim 9 further comprising bonding at least one device to at least one substrate using a quantity of connective material.

13. The method of claim 9 further comprising connecting the plurality of chip packages to a quantity of external circuitry.

14. The method of claim 9 further comprising disposing a layer of conductive material onto at least one surface of the plurality of substrates.

15. The method of claim 9 wherein the operational attribute is high speed performance of the device.

* * * * *